(12) United States Patent
Yoon et al.

(10) Patent No.: US 11,992,102 B2
(45) Date of Patent: May 28, 2024

(54) CASE FOR ELECTRONIC DEVICE

(71) Applicant: Samsung Electronics Co., Ltd., Gyeonggi-do (KR)

(72) Inventors: Jongmin Yoon, Gyeonggi-do (KR); Sungkwang Yang, Gyeonggi-do (KR); Joonyoung Song, Gyeonggi-do (KR); Hyunmo Yang, Gyeonggi-do (KR); Kyuhyung Cho, Gyeonggi-do (KR); Nammin Jo, Gyeonggi-do (KR); Heonjun Ha, Gyeonggi-do (KR); Seungnyun Kim, Gyeonggi-do (KR); Kihuk Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 17/716,271

(22) Filed: Apr. 8, 2022

(65) Prior Publication Data
US 2022/0322800 A1 Oct. 13, 2022

Related U.S. Application Data

(63) Continuation of application No. PCT/KR2022/005083, filed on Apr. 8, 2022.

(30) Foreign Application Priority Data

Apr. 9, 2021 (KR) .................. 10-2021-0046603

(51) Int. Cl.
*A45C 11/04* (2006.01)
*A45C 13/00* (2006.01)
(Continued)

(52) U.S. Cl.
CPC ............ *A45C 11/04* (2013.01); *A45C 13/005* (2013.01); *H05K 9/0067* (2013.01); *H05K 9/0079* (2013.01); *A45C 2011/003* (2013.01)

(58) Field of Classification Search
CPC . A45C 11/04; A45C 13/005; A45C 2011/003; H05K 9/0067; H05K 9/0079
(Continued)

(56) References Cited

U.S. PATENT DOCUMENTS 5,886,822 A 3/1999 Spitzer
9,482,883 B1 11/2016 Meisenholder
(Continued)

FOREIGN PATENT DOCUMENTS

CN 105559302 A 5/2016
CN 107957627 A 4/2018
(Continued)

OTHER PUBLICATIONS

International Search Report dated Jul. 15, 2022.

*Primary Examiner* — Jacob K Ackun
(74) *Attorney, Agent, or Firm* — Cha & Reiter, LLC

(57) ABSTRACT

Various embodiments of the disclosure relate to, e.g., a case of a wearable electronic device wearable on a human body portion. According to certain embodiments of the disclosure, there may be provided an electronic device case for storing a wearable electronic device comprising a case housing forming a space for receiving the wearable electronic device, a conductive supporting member disposed in the case housing, and a contact member disposed in the space for receiving the wearable electronic device and exposed to an exterior when the case housing is opened, electrically connected with the conductive supporting member, and configured to at least partially contact a conductive portion of the wearable electronic device. Other various embodiments are also possible.

20 Claims, 11 Drawing Sheets

(51) Int. Cl.
*H05K 9/00* (2006.01)
*A45C 11/00* (2006.01)

(58) Field of Classification Search
USPC .......................................................... 206/5, 6
See application file for complete search history.

(56) References Cited

U.S. PATENT DOCUMENTS

| | | | |
|---|---|---|---|
| 2009/0255845 A1* | 10/2009 | Beitman | G03B 17/56 |
| | | | 206/720 |
| 2010/0320961 A1 | 12/2010 | Castillo et al. | |
| 2011/0304715 A1 | 12/2011 | Yamada et al. | |
| 2014/0284571 A1* | 9/2014 | Nomura | H04N 13/344 |
| | | | 257/40 |
| 2014/0305814 A1 | 10/2014 | Santarelli | |
| 2016/0291327 A1* | 10/2016 | Kim | G02B 27/0176 |
| 2017/0093079 A1 | 3/2017 | Wagman et al. | |
| 2017/0205874 A1* | 7/2017 | Miyaguchi | G06F 3/0304 |
| 2017/0248799 A1 | 8/2017 | Streets et al. | |
| 2018/0136491 A1 | 5/2018 | Ashwood et al. | |
| 2019/0069066 A1 | 2/2019 | Song et al. | |
| 2019/0208043 A1* | 7/2019 | Cha | G06F 1/1643 |

FOREIGN PATENT DOCUMENTS

| | | |
|---|---|---|
| CN | 213151682 U | 5/2021 |
| JP | 2001-522063 A | 11/2001 |
| JP | 2012-4717 A | 1/2012 |
| KR | 10-2018-0118180 A | 10/2018 |
| KR | 10-2019-0000873 A | 1/2019 |
| KR | 10-2019-0021033 A | 3/2019 |
| WO | 2018/058130 A1 | 3/2018 |

* cited by examiner

CASE FOR ELECTRONIC DEVICE

CROSS-REFERENCE TO RELATED APPLICATION(S)

This application is a Continuation of International Application No. PCT/KR2022/005083 which was filed on Apr. 8, 2022, and claims priority to Korean Patent Application No. 10-2021-0046603, filed on Apr. 9, 2021, in the Korean Intellectual Property Office, the disclosure of which are incorporated by reference herein their entirety.

BACKGROUND

1. Technical Field

Various embodiments of the disclosure relate to an electronic device case, e.g., a case capable of accommodating a wearable electronic device that may be worn on a portion of a human body.

2. Description of Related Art

Portable electronic devices, such as electronic schedulers, portable multimedia players, mobile communication terminals, tablet personal computers (PCs), etc., are generally equipped with a display member and a battery, and may be limited in shape to a bar, clamshell, or slidable shape by their accompanying displays or batteries. As display members and batteries are nowadays made smaller and have enhanced performance, wearable electronic device which may be put on the user's wrist, head, or other body portions are commercially available. Wearable electronic devices may be directly worn on the human body, presenting better portability and user accessibility.

Among these wearable electronic devices, some electronic devices, e.g., head-mounted devices (HMDs), may be worn on the user's face. The head-mounted device may be advantageously used to implement virtual reality (VR) or augmented reality (AR). For example, the wearable electronic device may stereoscopically provide images of a virtual space for a game conventionally played on TV or computer monitor to implement virtual reality. Other types of wearable electronic devices may implement virtual images while providing an environment in which the real-world image of the space where the user is in may still be visually perceived by the user, thereby implementing augmented reality to provide various pieces of visual information to the user.

SUMMARY

Head-mounted wearable devices include VR glasses and AR glasses which consist of glasses-shaped frames and one or more display members fitted to the frames to display virtual objects though the display member.

A case for storing the wearable electronic device may be used to protect the wearable electronic device from external impact and to charge the wearable electronic device with power. However, static electricity may be generated while the user takes out the wearable electronic device from the case or when the user puts it back in. An electrical path may be formed between the wearable electronic device and a circuit unit embedded in the case, and when static electricity having a high voltage is instantaneously introduced, the circuit unit embedded in the case may be damaged. For example, when the temple portions of the AR glasses are folded and stored in the case, the metal hinge portions may be exposed, and static electricity may be introduced thereto. In such a structure, there is no conventional way to address static electricity caused in AR glasses The disclosure provides various embodiments for preventing damage to a wearable electronic device and a case for protecting the wearable electronic device, due to static electricity by discharging the static electricity that may occur in the wearable electronic device.

According to various embodiments of the disclosure, there may be provided an electronic device case for storing a wearable electronic device comprising a case housing forming a space for receiving the wearable electronic device, a conductive supporting member disposed in the case housing, and a contact member disposed in the space for receiving the wearable electronic device and exposed to an exterior when the case housing is opened, electrically connected with the conductive supporting member, and configured to at least partially contact a conductive portion of the wearable electronic device.

According to various embodiments of the disclosure, there may be provided an electronic device case for storing a wearable electronic device comprising a case housing, a bracket disposed in the case housing, a first case circuit board disposed in a position adjacent to the bracket, inside the case housing, a contact member disposed to be exposed to an exterior when the case housing is opened and configured to at least partially contact a conductive portion of the wearable electronic device, a second case circuit board disposed between the contact member and the bracket, at least one connector disposed on a side of the case housing configured to transmit/receive power or data, a first electric shock reducing element disposed on the second case circuit board to connect the contact member and the bracket when static electricity is generated in the wearable electronic device, and a second electric shock reducing element disposed on the first case circuit board to connect the at least one connector and the bracket when static electricity is generated in the at least one connector.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTIONS

The disclosure provides certain embodiments for preventing damage to a wearable electronic device and a case for protecting the wearable electronic device, due to static electricity by discharging the static electricity that may occur in the wearable electronic device.

According to certain embodiments of the disclosure, it is possible to prevent damage to a wearable electronic device and a case for protecting the wearable electronic device, due to static electricity by discharging the static electricity that may occur in the wearable electronic device.

Other various effects may be provided directly or indirectly in the disclosure.

Figure 1:
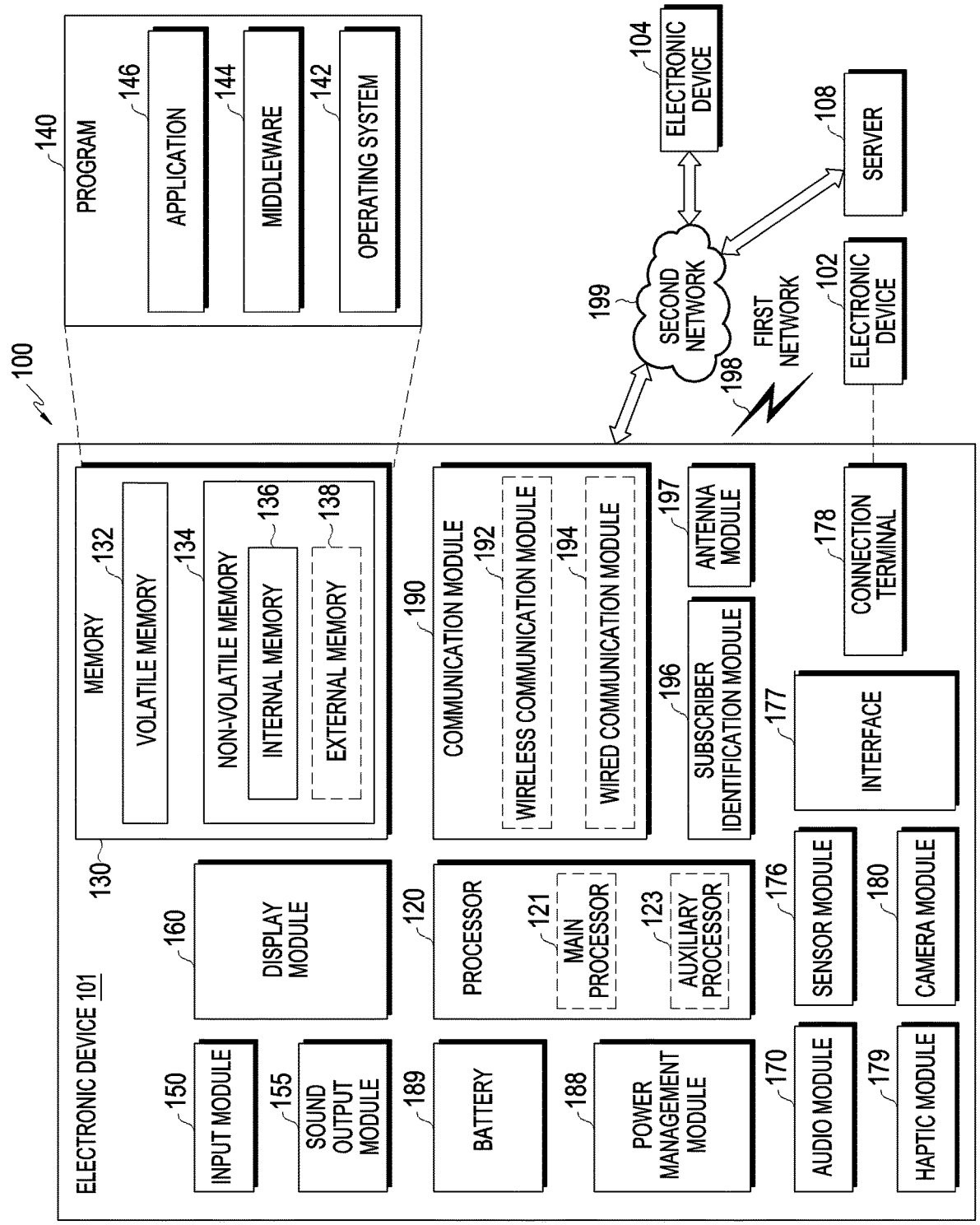
FIG. 1 is a block diagram illustrating an electronic device in a network environment according to various embodiments of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

Figure 2:
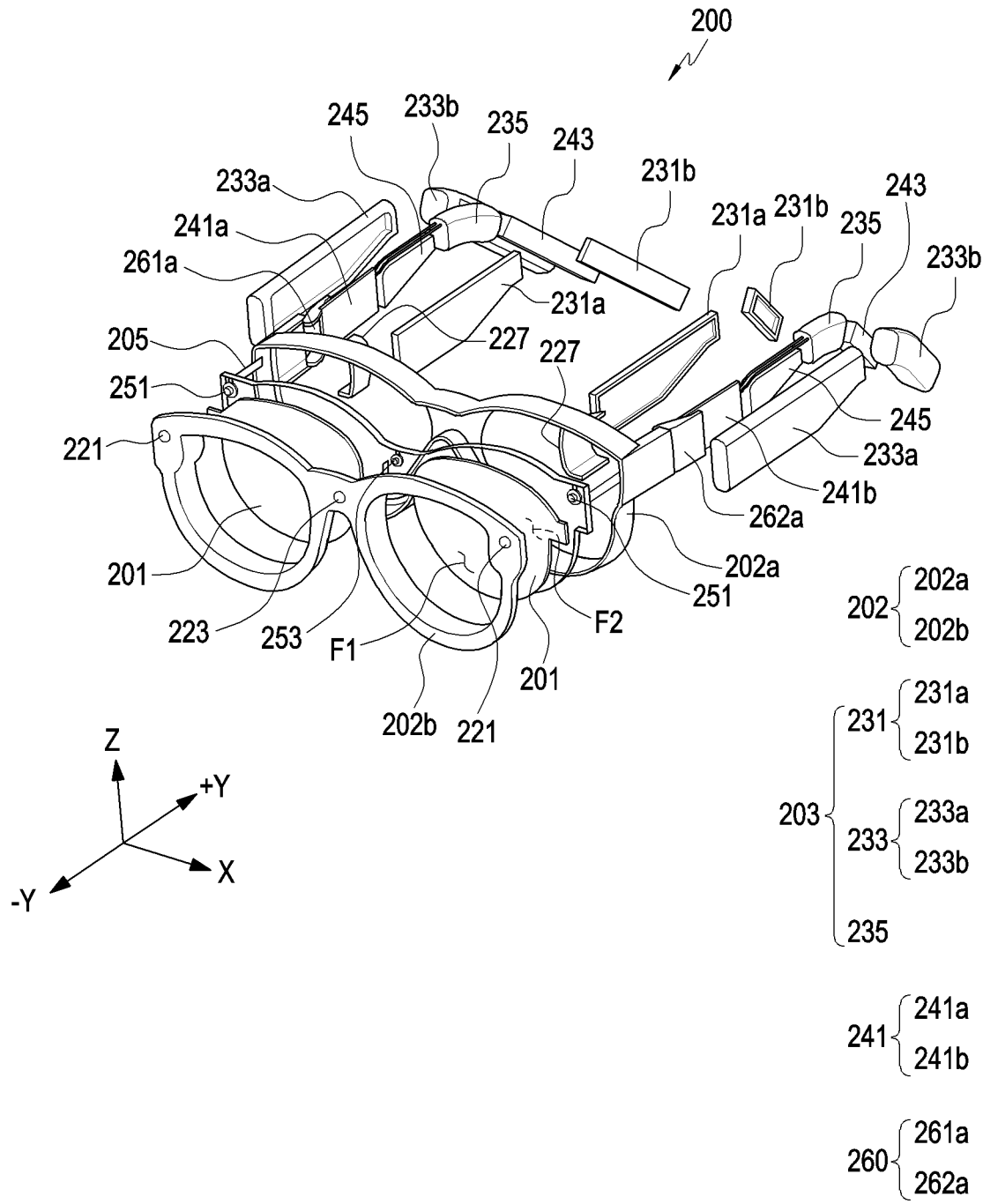
FIG. 2 is an exploded perspective view illustrating a wearable electronic device according to various embodiments of the disclosure.
Figure 3:
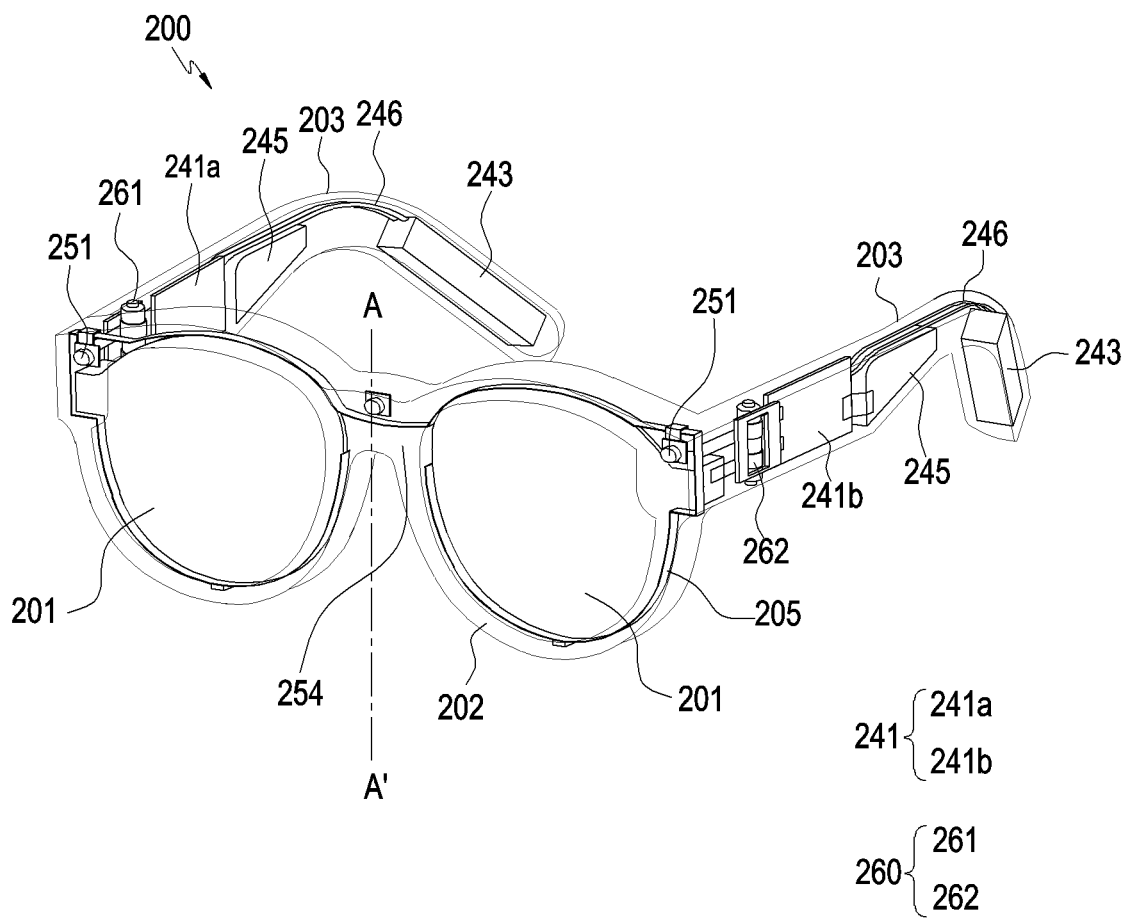
FIG. 3 is a perspective view illustrating an assembled wearable electronic device according to various embodiments of the disclosure.

FIG. 2 is an exploded perspective view illustrating a wearable electronic device 200 (e.g., the electronic device 101 of FIG. 1) according to various embodiments of the disclosure. FIG. 3 is a perspective view illustrating an assembled wearable electronic device 200 (e.g., the electronic device 101 of FIG. 1) according to various embodiments of the disclosure. FIGS. 2-3 illustrate the electronic components of the wearable electronic device 200 and the arrangement between the electronic components thereof according to various embodiments.

Referring to FIGS. 2 and 3, the wearable electronic device 200 (e.g., an electronic device 101 of FIG. 1) may be an electronic device in the form of a pair of glasses, and the user may visually recognize the surrounding objects or environment even while wearing the wearable electronic device 200. The wearable electronic device 200 may obtain and/or recognize a visual image regarding an object or environment in the direction (e.g., −Y direction) in which the wearable electronic device 200 faces or the direction in which the user gazes, using the camera module 251 (e.g., the camera module 180 of FIG. 1) and may receive information regarding the object or environment from an external electronic device (e.g., the electronic device 102 or 104 or the server 108 of FIG. 1) through a network (e.g., the first network 198 or second network 199 of FIG. 1). In another embodiment, the wearable electronic device 200 may provide the received object- or environment-related information, as audio or visual data, to the user. For example, the wearable electronic device 200 may provide the received object- or environment-related information, as visual data, to the user through the display members 201, using the display module (e.g., the display module 160 of FIG. 1). The wearable electronic device 200 may implement augmented reality by visually displaying information regarding things or environment (e.g., hereinafter referred to as 'augmented reality object') and combining it with the actual image (or video) of the environment around the user. The display member 201 may output a screen in which the augmented reality object is added to the actual image (or video) of the environment around the user, thereby providing information regarding the surrounding thing or environment to the user.

In the following detailed description, the "state or position in which the electronic device or a designated component of the electronic device faces the user's face" may be mentioned in various manners and it should be noted that this presumes that the user wears the wearable electronic device 200.

According to various embodiments, the wearable electronic device 200 may include at least one display member 201, a lens frame 202, and a wearing member 203. A pair of display members 201 including a first display member 201a and a second display member 201b may be provided and be disposed to correspond to the user's right and left eyes, respectively, while the wearable electronic device 200 is worn on the user's body. According to an embodiment, the first display member 201a and the second display member 201b may be spaced apart from each other by a predetermined distance with a connecting member 254 (e.g., a bridge) interposed therebetween. Although not shown in the drawings, the connecting member 254 may be configured to be able to adjust the spacing between the display members 201a and 201b in order to accommodate the user's head shape. In some embodiments, the wearable electronic device 200 may have a shape (e.g., visor shape) including a single display member 201 that corresponds to both the right eye and the left eye.

According to an embodiment, the display member 201 is a component for providing the user with visual information. The display member 201 may include a module having, e.g., lens, display, and/or touch circuitry. The lens and the display may be formed to be transparent or semi-transparent. As another example, the display member 201 may include a window member that may be a semi-parent glass or a member capable of adjusting its light transmittance depending on the concentration of coloring. As another example, the display member 201 may include a reflective lens or a lens including a waveguide. An image output from the light output device (e.g., a projector) may form on each lens, providing the user with visual information. For example, the display member 201 may include a waveguide (e.g., light waveguide) in at least a portion of each lens and transfer the image (or light) output from the light output device through the waveguide included in the display member 201 to the user's eye while simultaneously transferring images of the real world through the area to the user's eye due to its transparent properties.

According to various embodiments, the waveguide may include glass, plastic, or polymer and may include a grating structure in at least a portion (inside or outside) of the waveguide. For example, the grating structure may be formed in a polygonal or curved shape, and it may include a nanopattern. For example, the light transferred from the light output device and/or the user may be redirected by the nanopattern.

According to various embodiments, the display member 201 may have a first surface F1 facing in a direction (e.g., −Y direction) in which external light is incident and a second surface F2 facing in a direction (e.g., +Y direction) opposite to the first surface F1. In a state where the user wears the electronic device 200, the second surface F2 of the display member 201 is disposed to face the user's left and/or right eye and at least partially transmits the light or image incident through the first surface F1 to the user's left eye and/or right eye. According to various embodiments, the lens frame 202 is a structure at least partially surrounding the edge of the display member 201 to fix at least a portion of the display members 201 and may correspond to the rim of the glasses and may be supported or positioned on the user's face while the user wears the wearable electronic device 200. For example, the lens frame 202 may position at least one of the display members 201 to correspond to at least one of the user's eyes. According to an embodiment, the lens frame 202 may serve as the rim of a normal eyeglass structure. In an embodiment, the lens frame 202 may at least partially include a material, e.g., metal, with good thermal conductivity. The thermally conductive material may include, e.g., a metallic material, but is not limited thereto, and any material having good thermal conductivity may be used as the material for manufacturing the lens frame 202 even if it is not metallic. The lens frame 202 is a structure substantially exposed to the exterior of the wearable electronic device 200 and may be easily processed or shaped by including not only a metallic material having thermal conductivity but also a polymer, such as polycarbonate. In the illustrated embodiment, the lens frame 202 may have a closed loop shape surrounding the display member 201.

According to various embodiments, the lens frame 202 may be formed of a combination of at least two frames. For example, the lens frame 202 may include a first frame 202a and a second frame 202b. According to the embodiment illustrated in FIG. 2, the first frame 202a may form a frame structure of a portion facing the user's face when the user wears the wearable electronic device 200, and the second frame 202b may form a frame structure of a portion facing in the direction of the user's gaze when the user wears the wearable electronic device 200. However, the specific shapes of the first frame 202a and the second frame 202b and the coupling relationship between these structures may vary according to different embodiments.

According to various embodiments, the wearable electronic device 200 may include a camera module 251 (e.g., the camera module 180 and/or the sensor module 253 (e.g., the sensor module 176 of FIG. 1) of FIG. 1) disposed on the lens frame 202. The flexible printed circuit board 205 may electrically connect the camera module 251 and/or the sensor module 253 to a circuit board 241 (e.g., a printed circuit board (PCB), a printed board assembly (PBA), a flexible PCB (FPCB), or a rigid-flexible PCB (RFPCB)) disposed in the wearing member 203. The camera module 251 may obtain an image of a surrounding object or environment through a first optical hole 221 formed in the lens frame 202. The camera modules 251 and/or first optical holes 221 may be disposed on two opposite sides of the lens frame 202 (e.g., the second frame 202b), e.g., formed in two opposite ends of the lens frame 202 (e.g., the second frame 202b) with respect to the direction of the X axis. The processor (e.g., the processor 120 of FIG. 1) of the electronic device 200 may recognize the object or environment based on the image obtained through the camera module 251. In some embodiments, the wearable electronic device 200 (e.g., the processor 120 or the communication module 190 of FIG. 1) may transmit the image obtained through the camera module 251 to an external electronic device (e.g., the electronic device 102 or 104 or server 108 of FIG. 1) and request information regarding the image.

According to various embodiments, the flexible printed circuit board 205 may extend from the circuit board 241 across the hinge structure 260 to the inside of the lens frame 202. According to an embodiment, the flexible printed circuit board 205 may be disposed in at least a portion of the lens frame 202 surrounding the display member 201. For example, the camera module 251 and/or the sensor module 253 may be disposed substantially in the lens frame 202 using the flexible printed circuit board 205 and may be positioned around the display member 201.

According to various embodiments, the sensor module 253 may include a proximity sensor and it may be electrically connected to the circuit board 241 through the flexible printed circuit board 205. The sensor module 253 may detect whether the user's body (e.g., finger) approaches the display member 201 or remains close to the display member 201 within a predetermined distance through the second optical hole 223 formed in the second frame 202b. The sensor module 253 and/or the second optical hole 223 may be disposed in the central portion of the lens frame 202, between the camera modules 251, e.g., in the direction of the X axis. In the instant embodiment, in one example the wearable electronic device 200 includes one sensor module 253 (e.g., a proximity sensor) and one second optical hole 223. However, the present disclosure is not limited thereto. Various numbers and/or positions may exist for the second optical hole 223 and sensor module 253 to more accurately detect the approach or proximity of the user's body.

According to various embodiments, if the approach of the user's body is detected through the sensor module 253 (e.g., a proximity sensor), the processor (e.g., the processor 120 of FIG. 1) may be configured to perform a designated function. In some embodiments, if approach of the user's body is detected, the processor 120 may store the image obtained through the camera module 251. For example, the processor 120 may execute various functions based on the signal detected through a proximity sensor (e.g., the sensor module 253) according to the operation mode of the wearable electronic device 200. In some embodiments, the sensor module 253 may include a gaze tracking sensor (not shown). For example, the wearable electronic device 200 may track the user's gaze (e.g., pupil) by including a gaze tracking sensor and adjust the position and/or size of the image output through the display module (e.g., the display module 160 of FIG. 1) according to the user's gaze and provided to the user through the display member 201. For example, the gaze tracking sensor may include at least one of a vertical cavity surface emitting laser (VCSEL), an infrared sensor, and/or a photodiode. For example, the photodiode may include a positive intrinsic negative (PIN) photodiode or an avalanche photodiode (APD). The photodiode may be referred to as a photo detector or a photo sensor.

In some embodiments, the sensor module 253 may include an illuminance sensor. For example, the illuminance sensor is a sensor for detecting the illuminance (or brightness) of the surroundings of the wearable electronic device 200 or the user's eyes, and the wearable electronic device 200 may control the light output device based on the illuminance (or brightness) detected through the illuminance sensor.

According to various different embodiments, the camera module 251 may be replaced with the sensor module 253, or vice versa, the sensor module 253 may be replaced with the camera module 251. According to other embodiments, the camera module 251 and/or the sensor module 253 may be provided in positions different from their respective positions shown in FIGS. 2 and 3, in the lens frame 202. Further, the wearable electronic device 200 may have more camera modules and/or sensor modules, in addition to the camera module 251 and/or the sensor module 253 shown in FIGS. 2 and 3. Although not shown in the drawings, the wearable electronic device 200 may further include a gaze tracking camera and/or a gesture detecting camera disposed on the lens frame 202.

According to various embodiments, the wearable electronic device 200 may include at least one light emitting unit in an area adjacent to the camera module 251. According to an embodiment, the light emitting unit may emit light in a visible light band or an infrared (IR) band. According to an embodiment, the light emitting unit may include a light emitting diode (LED). For example, the light emitting unit may provide state information about the wearable electronic device 200 and/or a light source that interworks with the operation of the camera module 251 under the control of a lighting device driver.

According to various embodiments, the wearable electronic device 200 may include a pair of wearing members 203 corresponding to the temples of glasses. For example, the pair of wearing members 203 may include a first wearing member 203a and a second wearing member 203b. The pair of wearing members 203 each may extend from the lens frame 202 and, together with the lens frame 202, may be partially supported or positioned on the user's body (e.g., ears). In an embodiment, the wearing member 203 may be pivotably coupled to the lens frame 202 through a hinge structure 260 corresponding to the endpiece of the lens frame 202. While the wearable electronic device 200 is not in use, the user may fold the wearing members 203 to the lens frame 202 for convenient carrying or storage. A portion of the hinge structure 260 may be mounted on the lens frame 202, and another portion may be received or mounted into the wearing member 203. A hinge cover 227 may be mounted on the lens frame 202 to conceal a portion of the hinge structure 260, and another portion of the hinge structure 260 may be received or hidden between the inner case 231 and the outer case 233 to be described below. The hinge structure 260 may include a first hinge structure 261 pivotably connecting the lens frame 202 and the first wearing member 203a and a second hinge structure 262 pivotably connecting the lens frame 202 and the second wearing member 203b.

According to various embodiments, the wearable electronic device 200 may include various electronic components positioned on the wearing member 203, e.g., the circuit board 241, the battery 243, another display module (e.g., the display module 160 of FIG. 1), and/or the speaker module 245. Various electronic components received in the wearing members 203 may be electrically connected through a circuit board (e.g., the circuit board 241, a flexible printed circuit board (e.g., the flexible printed circuit board 205), conductive cables or connectors). According to an embodiment, at least one integrated circuit chip may be mounted on the circuit board 241. Circuit devices, such as the processor 120, communication module 190, power management module 188, or memory 130 of FIG. 1, may be provided in an integrated circuit chip. Various electronic components received in the wearing member 203 may be mounted on the circuit board 241.

According to various embodiments, the circuit board 241 may include a first circuit board 241a and a second circuit board 241b respectively disposed on the pair of wearing members. Further, the wearable electronic device 200 may further include another circuit board not shown in the drawings. For example, the wearable electronic device 200 may further include an auxiliary circuit board supporting the first circuit board 241a and/or the second circuit board 241b. According to various different embodiments, various electronic components included in the wearable electronic device 200 may be mounted on the first circuit board 241a and/or the second circuit board 241b, and some electronic components may be mounted on the auxiliary circuit board.

According to various embodiments, the wearing member 203 may include the inner case 231 and the outer case 233. The inner case 231 may be, e.g., a case configured to directly contact the user's body, and may be formed of a material having low thermal conductivity, e.g., a synthetic resin. The outer case 233 may include, e.g., a material (e.g., a metal) capable of at least partially transferring heat and may be coupled to the inner case 231 to face each other. In an embodiment, the circuit board 241 or the speaker module 245 may be received in a space separated from the battery 243 in the wearing member 203. In the illustrated embodiment, the inner case 231 may include a first case 231a receiving the circuit board 241 or the speaker module 245 and a second case 231b receiving the battery 243, and the outer case 233 may include a third case 233a coupled to face the first case 231a and a fourth case 233b coupled to face the second case 231b. For example, the first case 231a and the third case 233a may be coupled (hereinafter, "first case portions 231a and 233a") to receive the circuit board 241 or the speaker module 245, and the second case 231b and the fourth case 233b may be coupled (hereinafter, "second case portions 231b and 233b") to receive the battery 343. According to another embodiment, the wearable electronic device 200 may further include a wire 246 for electrically connecting the battery 243 and the circuit board 241 positioned on the wearing member 203.

According to various embodiments, the first case portions 231a and 233a may be rotatably coupled to the lens frame 202 through the hinge structure 260, and the second case portions 231b and 233b may be connected or mounted to the ends of the first case portions '231a and 233a through the connecting member 235. In some embodiments, a portion of the connecting member 235 in contact with the user's body may be formed of a material having low thermal conductivity, e.g., an elastic material, such as silicone, polyurethane, or rubber, and another portion thereof which does not come into contact with the user's body may be formed of a material having high thermal conductivity (e.g., a metal). For example, when heat is generated from the circuit board 241 or the battery 243, the connecting member 235 may block heat transfer to the portion in contact with the user's body while dissipating or discharging heat through the portion not in contact with the user's body. In some embodiments, a portion of the connecting member 235 configured to come into contact with the user's body may be referred to as a portion of the inner case 231, and a portion of the connecting member 235 that does not come into contact with the user's body may be referred to as a portion of the outer case 233.

The lens frame (e.g., the lens frame 202 of FIG. 2) may include a connecting member (e.g., the connecting member 254 of FIG. 3) between the first display member 201a and the second display member 201b. The connecting member of the lens frame may be a portion corresponding to the nose pad of the glasses.

According to various embodiments of the disclosure, various components included in the wearable electronic device 200 may be distributed symmetrically on one side and another of the wearable electronic device 200 with respect to the virtual line A-A' dividing the first display member 201a and the second display member 201b to the left/right. Various components included in the electronic device case 300 described below may also be distributed symmetrically on one side and another of the case 300 with respect to the virtual line A-A'.

Figure 4:
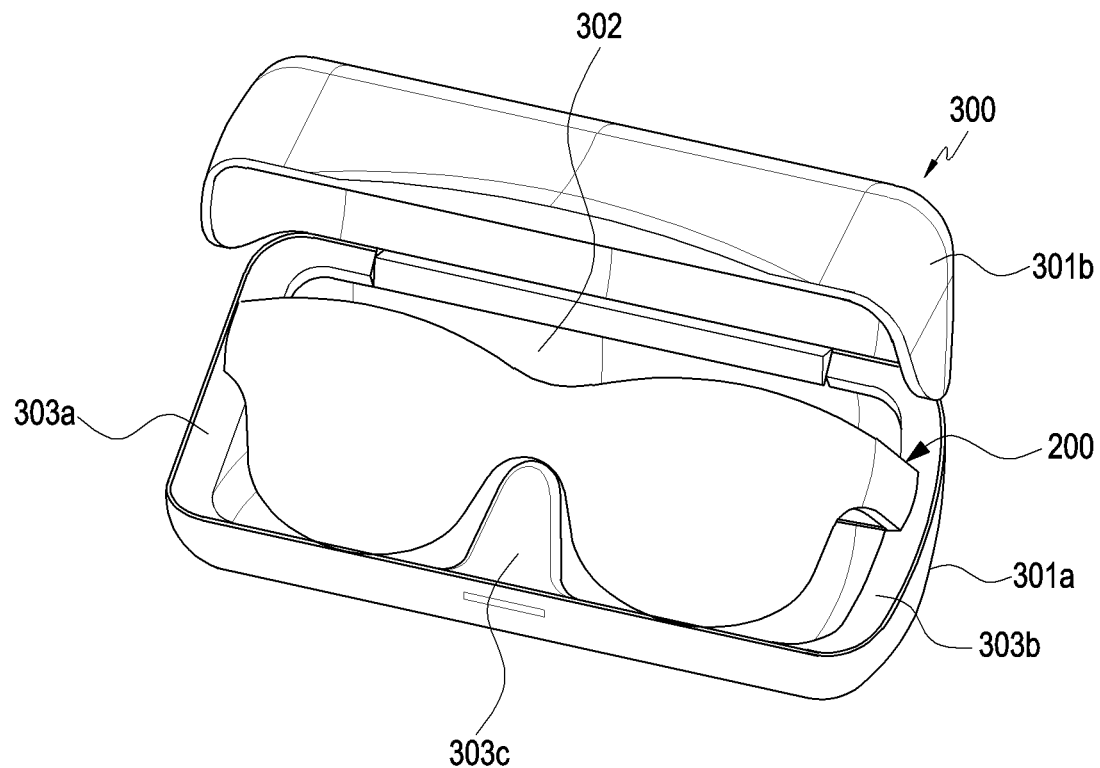
FIG. 4 is a perspective view illustrating a wearable electronic device and an electronic device case for storing the same according to various embodiments of the disclosure.

FIG. 4 is a perspective view illustrating a wearable electronic device 200 (e.g., the electronic device 101 of FIG. 1) and an electronic device case 300 for storing the same according to various embodiments of the disclosure. FIG. 4 illustrates an opened state of the electronic device case 300. In this case, the wearable electronic device 200 is placed in the electronic device case 300.

According to various embodiments the electronic device case 300 (hereinafter, simply 'case 300') may include a case housing 301 including a first cover 301a (or first half shell) and a second cover 301b (or a second half shell) rotatable about the first cover 301a.

According to various embodiments, the case housing 301 may be formed to surround at least a portion of the wearable electronic device 200. In the closed state of the electronic device case 300, the front cover 301a and the second cover 301b of the case housing 301 may face each other, and a space for receiving at least a portion of the wearable electronic device 200 may be formed therein.

According to various embodiments, a seating portion 302 may be formed in the front cover 301a to seat at least a portion of the wearable electronic device 200. As the seating portion 302 is formed in the front cover 301a, the wearable electronic device 200 may be received in the space, with at least a portion of the wearable electronic device 200 seated on the seating portion 302. According to another embodiment, the front cover 301a may include a mounting portion 303 for the mounting of at least a portion of the wearable electronic device 200. Here, the mounting portion 303 may include a nose pad mounting portion 303c corresponding to the connecting member 254 of the wearable electronic device 200 and hinge mounting portions 303a and 303b corresponding to the hinge structure (e.g., the hinge structure 260 of FIG. 3) of the wearable electronic device 200. The nose pad mounting portion 303c may protrude from a central portion of the seating portion 302, and the hinge mounting portions 303a and 303b may protrude from the edge of the seating portion 302 and form a step.

According to various embodiments, the second cover 301b may rotate about the front cover 301a to face at least a portion of the front cover 301a and, in this state, the space for receiving the wearable electronic device 200 may be closed.

Static electricity may occur while the user pulls the wearable electronic device 200 out of the case 300 or puts it back in the case 300. As shown in FIG. 4, e.g., when the user folds the temples (e.g., the first wearing member 203a and/or the second wearing member 203b) of the wearable electronic device 200 and stores it in the case 300, the metallic hinge structure may be exposed and static electricity may be introduced therethrough.

Figure 5:
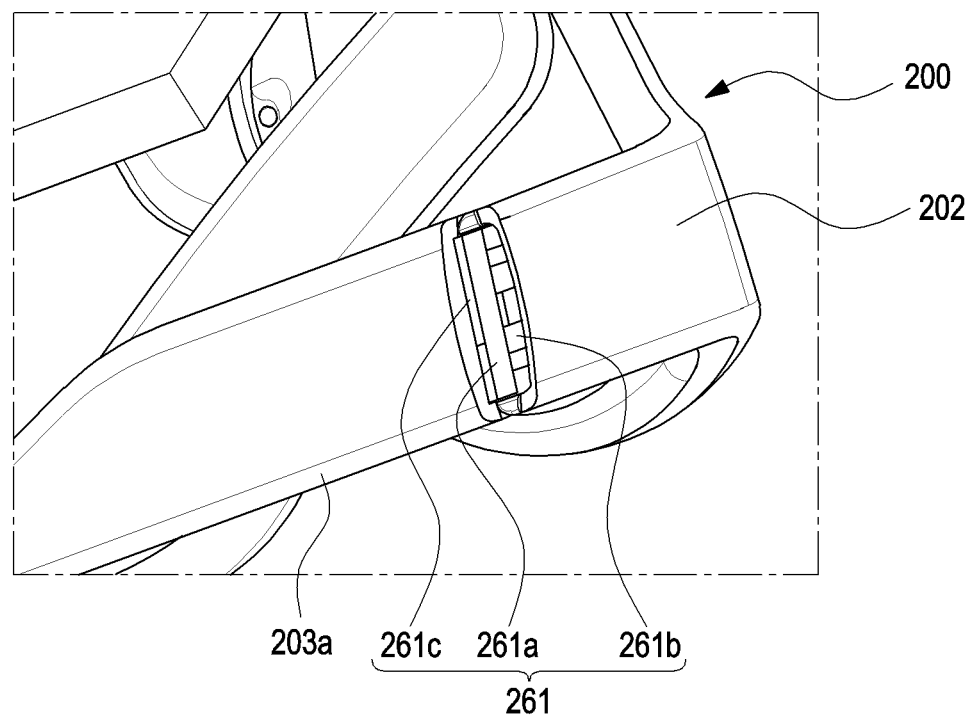
FIG. 5 is a view illustrating a hinge structure of a wearable electronic device according to an embodiment of the disclosure.
Figure 5:
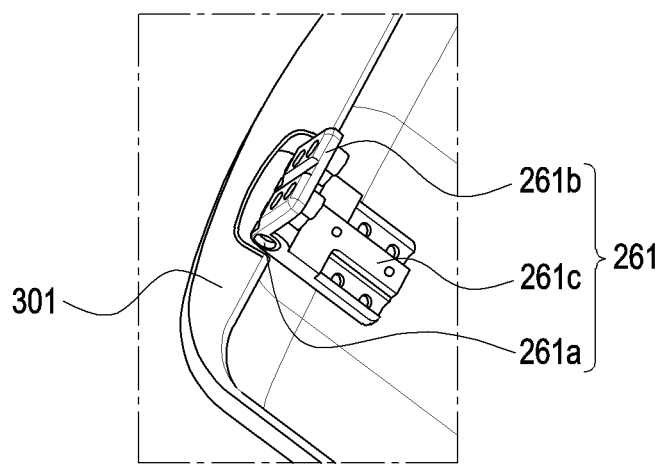
Figure 6:
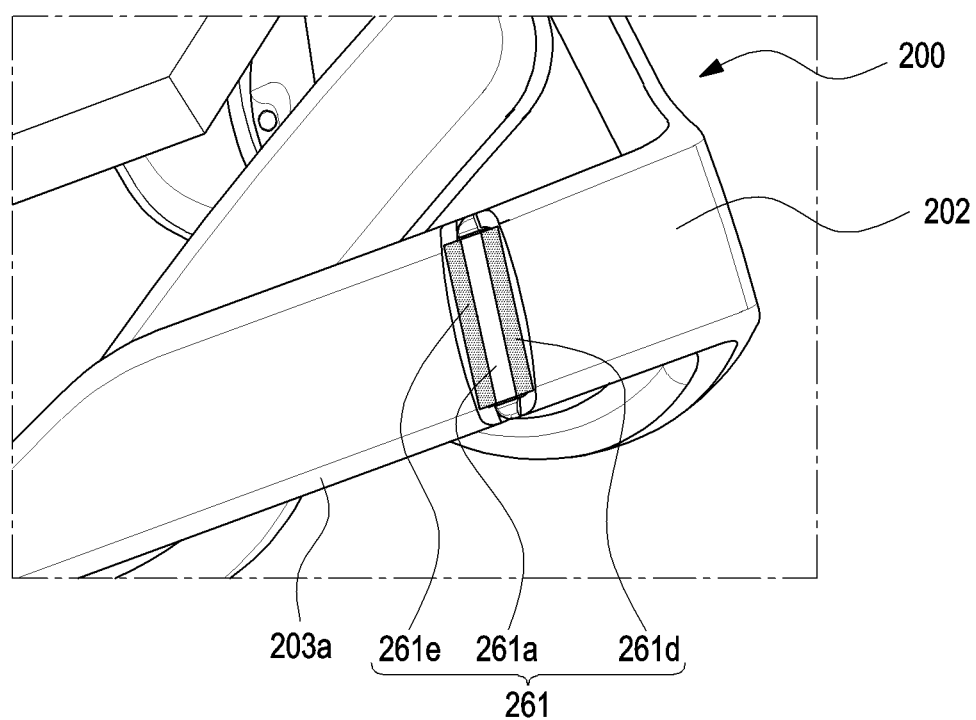
FIG. 6 is a view illustrating a hinge structure of a wearable electronic device according to another embodiment of the disclosure.

FIG. 5 is a view illustrating a hinge structure (e.g., the first hinge structure 261) of a wearable electronic device 200 according to an embodiment of the disclosure. FIG. 6 is a view illustrating a hinge structure (e.g., the first hinge structure 261) of a wearable electronic device 200 according to another embodiment of the disclosure.

In the wearable electronic device 200, the wearing member (e.g., the first wearing member 203a) may be folded about the frame (e.g., the lens frame 202) using the hinge structure (e.g., the first hinge structure 261). Referring to FIG. 5, when the first wearing member 203a is folded about the lens frame 202, at least a portion of the first hinge structure 261 may be exposed and, in this case, static electricity may be introduced through the externally exposed portion of the first hinge structure 261. Here, the first hinge structure 261 may be made of a metallic material. According to an embodiment, the first hinge structure 261 may include, e.g., a first hinge shaft 261a, a first hinge plate 261b extending from the first hinge shaft 261a to the lens frame 202, and a second hinge plate 261c extending to the first wearing member 203a. In general, most of the first hinge plate 261b and most of the second hinge plate 261c may be surrounded by the outer case (e.g., the outer case 233 of FIG. 2), but a portion adjacent to the first hinge shaft 261a may be at least partially exposed. As such, when the first hinge structure 261 is exposed, at least a portion of the first hinge shaft 261a, the first hinge plate 261b, and the second hinge plate 261c may contact at least a portion (e.g., the hinge mounting portion 303a) of the case 300. When at least a portion of the first hinge shaft 261a, the first hinge plate 261b, and the second hinge plate 261c contacts the case 300, a high voltage of static electricity may be instantaneously introduced, damaging the circuit unit embedded in the case 300.

Referring to FIG. 6, as an embodiment different from that of FIG. 5, the first hinge structure 261 may include, e.g., a first hinge shaft 261a, a first ground portion 261d extending from the lens frame 202 with respect to the first hinge shaft 261a and a second ground portion 261e extending from the first wearing member 203a. The first ground portion 261d is a portion extending from the frame (or rim), and the second ground portion 261e is a portion extending from the first wearing member 203a. In the unfolded state of the lens frame 202 and the first wearing member 203a, the first ground portion 261d and the second ground portion 261e may contact each other and electrically connect to each other. In this case, as the first ground portion 261d and the second ground portion 261e connect to each other, the area of the overall ground portion of the wearable electronic device 200 may be broad. In contrast, in the folded state of the lens frame 202 and the first wearing member 203a, the first ground portion 261d and the second ground portion 261e may be separated from each other and electrically disconnected. In the folded state of the lens frame 202 and the first wearing member 203a, the area of the overall ground portion of the wearable electronic device 200 may be relatively small. In the folded state of the lens frame 202 and the first wearing member 203a, at least a portion of the first hinge structure 261 may be exposed, and the area of the overall ground portion is relatively small. Thus, it may be vulnerable to static electricity in this case.

According to an embodiment, static electricity may occur while the user pulls out or puts the wearable electronic device 200 back in the case 300 according to the embodiment shown in FIG. 5 and/or FIG. 6. The disclosure provides various embodiments for preventing damage to a wearable electronic device 200 and a case for protecting the wearable electronic device, due to static electricity by discharging the static electricity that may occur in the wearable electronic device.

Figure 7:
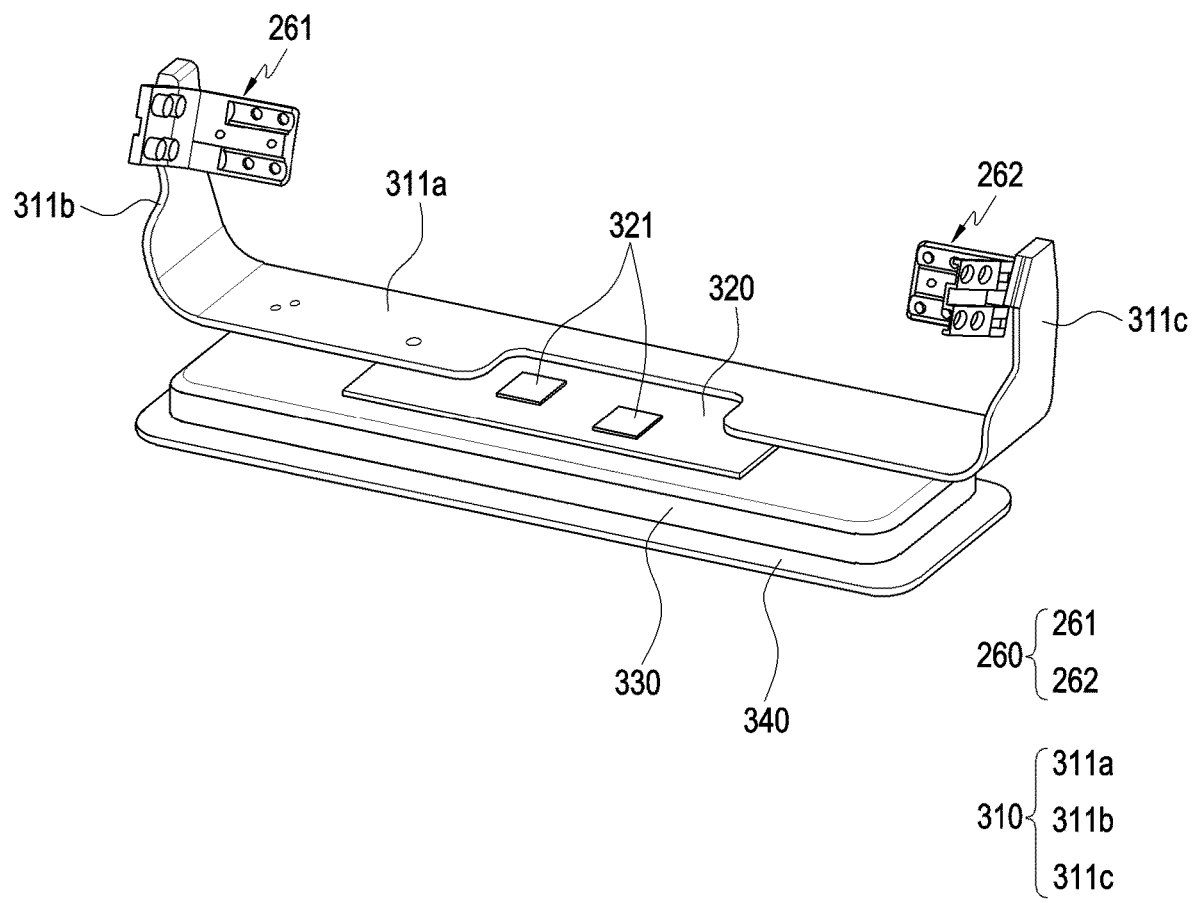
FIG. 7 is a view schematically illustrating components inside a case housing according to various embodiments of the disclosure.
Figure 8:
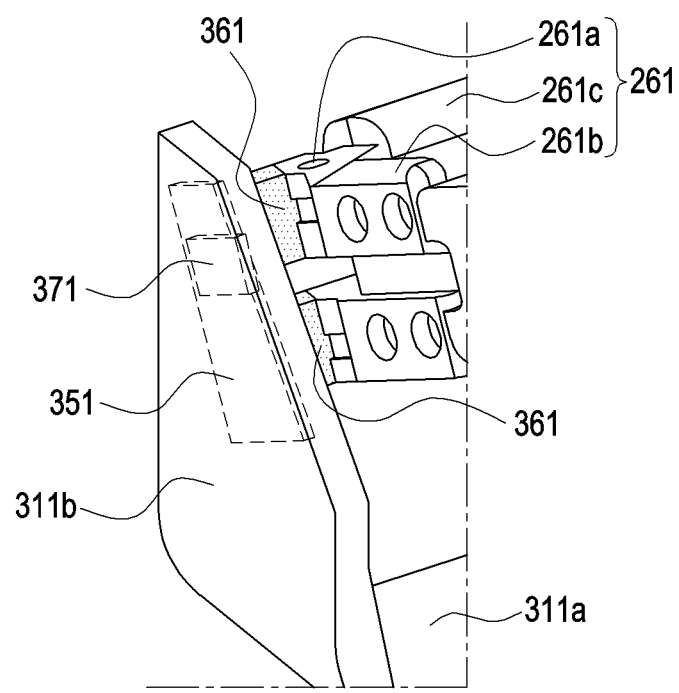
FIG. 8 is a view illustrating a state in which a first hinge structure contacts a contact member according to various embodiments of the disclosure.

FIG. 7 is a view schematically illustrating components inside a case housing (e.g., the case housing 301 of FIG. 4) according to various embodiments of the disclosure. FIG. 8 is a view illustrating a state in which a first hinge structure 261 contacts a contact member 360 according to various embodiments of the disclosure.

Referring to FIG. 7, according to various embodiments of the disclosure, a conductive supporting member 310, a main printed circuit board (main PCB) 320, a battery 330, and/or a wireless charging coil 340 may be provided in a case housing 301. In some embodiments, in the case housing 301, at least one (e.g., the battery 330 or the wireless charging coil 340) may be omitted, or other components may be added.

The conductive supporting member 310 may include a bracket. The conductive supporting member 310 may serve to form a framework inside the case housing 301 while preventing static electricity in the case housing 301. The conductive supporting member 310 may include, e.g., a metallic material. According to an embodiment, the conductive supporting member 310 may include a plate 311a and two arms 311b and 311c extending from one side and the other of the plate 311a toward the at least two hinge mounting portions (e.g., the hinge mounting portion 303a of FIG. 5). For example, the two arms 311b and 311c may extend substantially vertically from the plate 311a of the conductive supporting member 310. Referring to FIG. 8, an auxiliary circuit board (hereinafter, simply "second case circuit board") 351 may be disposed on an end of the conductive supporting member 310, e.g., the two arms 311b and 311c. Further, a first electric shock reducing element 371 may be disposed on the second case circuit board 351. The first electric shock reducing element 371 is described below in detail with reference to FIG. 9 or subsequent drawings.

A plurality of electronic components 321 may be mounted on the main printed circuit board (hereinafter, simply "first case circuit board") 320. The plurality of electronic components 321 may include, e.g., a processor, a memory, a battery power management module, and/or a communication module.

Referring to FIG. 8, the case 300 may further include a contact member (contact material) 361 disposed on the space where the wearable electronic device (e.g., the wearable electronic device 200 of FIG. 4) is received in the case housing 301, electrically connected with the at least one conductive supporting member 310, and provided to contact at least a portion of the metallic material of the wearable electronic device 200.

According to an embodiment, at least one component of the first hinge shaft 261a, the first hinge plate 261b extending from the first hinge shaft 261a to the lens frame 202, and the second hinge plate 261c extending to the first wearing member 203a in the wearable electronic device (e.g., the wearable electronic device 200 of FIG. 4) may be made of a metallic material. When the first hinge structure 261 is exposed, at least a portion of the first hinge shaft 261a, the first hinge plate 261b, and the second hinge plate 261c, which may be metallic, may physically contact at least a portion (e.g., the hinge mounting portion 303a) of the case 300. The contact member 361 of the disclosure may be formed at this portion of the case 300. Here, the contact member 361 may be, e.g., a gasket, a polyurethane foam and/or a C-clip. As another example, the contact member 361 may be made of a magnetic material. According to an embodiment, the contact member 361 may be configured in a shape corresponding to the hinge structure 261 when the wearable electronic device 200 is positioned in the case 300. According to an embodiment, at least a portion of the first hinge shaft 261a, the first hinge plate 261b, and the second hinge plate 261c, which may be metallic, may be made to contact the contact member 361. For example, the first hinge shaft 261a made of a metallic material may be made to contact the contact member 361. Alternatively, the first hinge shaft 261a made of a metallic material and the first hinge plate 261b or the first hinge shaft 261a and the second hinge plate 261c may be made to contact the contact member 361. According to another embodiment, the first hinge shaft 261a, the first hinge plate 261b, and the second hinge plate 261c may be made to all contact the contact member 361. In the above-described embodiments, the first hinge shaft 261a, the first hinge plate 261b, and the second hinge plate 261c (or the first hinge shaft 261a, the first ground portion 261d, and the second ground portion 261e) included in the first hinge structure 261 contact the contact member 361. Although the second hinge structure 262 is not specifically described above, the description of the first hinge structure 261 may be likewise applied to the second hinge structure 262 including a second hinge shaft (hereinafter, second hinge shaft 262a of FIG. 9), a first hinge plate, and a second hinge plate (hereinafter, second hinge plate 262c of FIG. 9) (or a second hinge shaft (hereinafter, second hinge shaft 262a of FIG. 9), a first ground portion (hereinafter, first ground portion 262d of FIG. 10), and a second ground portion (hereinafter, second ground portion 262e of FIG. 10)).

Figure 9:
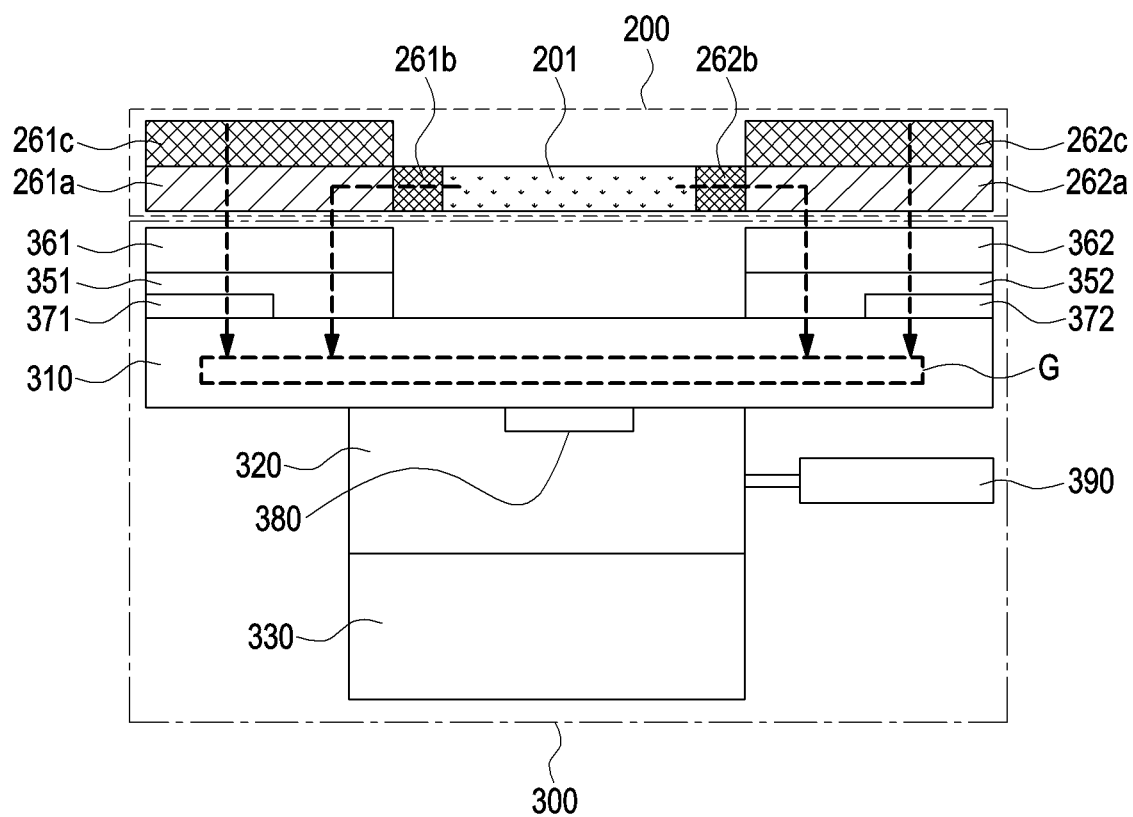
FIG. 9 is a view illustrating a case for preventing static electricity and a method for preventing static electricity using the same according to an embodiment of the disclosure.

FIG. 9 is a view illustrating a case 300 for preventing static electricity and a method for preventing static electricity using the same according to an embodiment of the disclosure.

FIG. 9 may be a schematic view conceptually illustrating a state in which the first hinge shaft 261a and the second hinge shaft 262a of the wearable electronic device 200 contact the contact members 360 disposed on two opposite ends of the conductive supporting member 310 of the case. In FIG. 9 and subsequent drawings, the wearable electronic device 200 is represented in dashed line, and the case 300 is represented in dashed-dotted line. In FIG. 9, the second case circuit board 350 may include two second case circuit boards 351 and 352 corresponding to two arms (e.g., 311b and 311c of FIG. 7) of the conductive supporting member 310. The contact member 360 may also include two contact members 361 and 362 corresponding to the two arms (e.g., 311b and 311c of FIG. 7) of the conductive supporting member 310. Further, the first electric shock reducing element 370 may also include two first electric shock reducing elements 371 and 372 corresponding to the two arms (e.g., 311b and 311c of FIG. 7) of the conductive supporting member 310. According to various embodiments, static electricity may be generated in the display member 201 (or the front part of the wearable electronic device including the display member) of the wearable electronic device 200, and static electricity may also be generated in the first hinge shaft 261a and the second hinge shaft 262a (or the hinge structure of the wearable electronic device including the first and second hinge shafts). Or, static electricity may occur in the first circuit board (e.g., the first circuit board 241a of FIG. 2) or the second circuit board (e.g., the second circuit board 241b of FIG. 2) of the wearable electronic device (or a side portion of the wearable electronic device including the second circuit board or the second circuit board). According to various embodiments, not only when static electricity is generated in the display member 201 or the first hinge shaft 261a and the second hinge shaft 262a of the wearable electronic device 200 but also when static electricity is generated in the first circuit board (e.g., the first circuit board 241a of FIG. 2) or the second circuit board (e.g., the second circuit board 241b of FIG. 2) of the wearable electronic device 200, there may be a need for a structure to prevent static electricity from flowing into the inside the case 300.

According to an embodiment of the disclosure, the case 300 may include at least one first electric shock reducing element 370 for preventing static electricity. The at least one first electric shock reducing element 370 may be, e.g., a varistor whose resistance changes according to voltages. The at least one first electric shock reducing element 370 may be disposed in a position adjacent to the contact member 360 while being mounted on the second case circuit board 350. Referring to FIGS. 8 and 9 together, e.g., the second case circuit board 350 may be disposed on an end of the arm (e.g., 311b or 311c in FIG. 7) extending from the plate 311a of the conductive supporting member 310. The first electric shock reducing element 370 may be formed to provide a discharge path of static electricity on the second case circuit board 350. The contact member 360 may be electrically connected to the second case circuit board 350, and the static electricity transferred through the contact member 360 may be discharged through the first electric shock reducing element 370 of the second case circuit board 350. According to various embodiments, in a state in which static electricity is not generated, the first electric shock reducing element 370 electrically separates the second case circuit board 350 and the conductive supporting member 310 and, when static electricity is generated, the first electric shock reducing element 370 may electrically connect the second case circuit board 350 and the conductive supporting member 310. According to an embodiment, the first electric shock reducing element 370 may be configured to electrically separate the second case circuit board 350 and the conductive supporting member 310 when a voltage of less than a designated magnitude is generated and to electrically connect the second case circuit board 350 and the conductive supporting member 310 when a voltage of more than the designated magnitude is generated.

Figure 10:
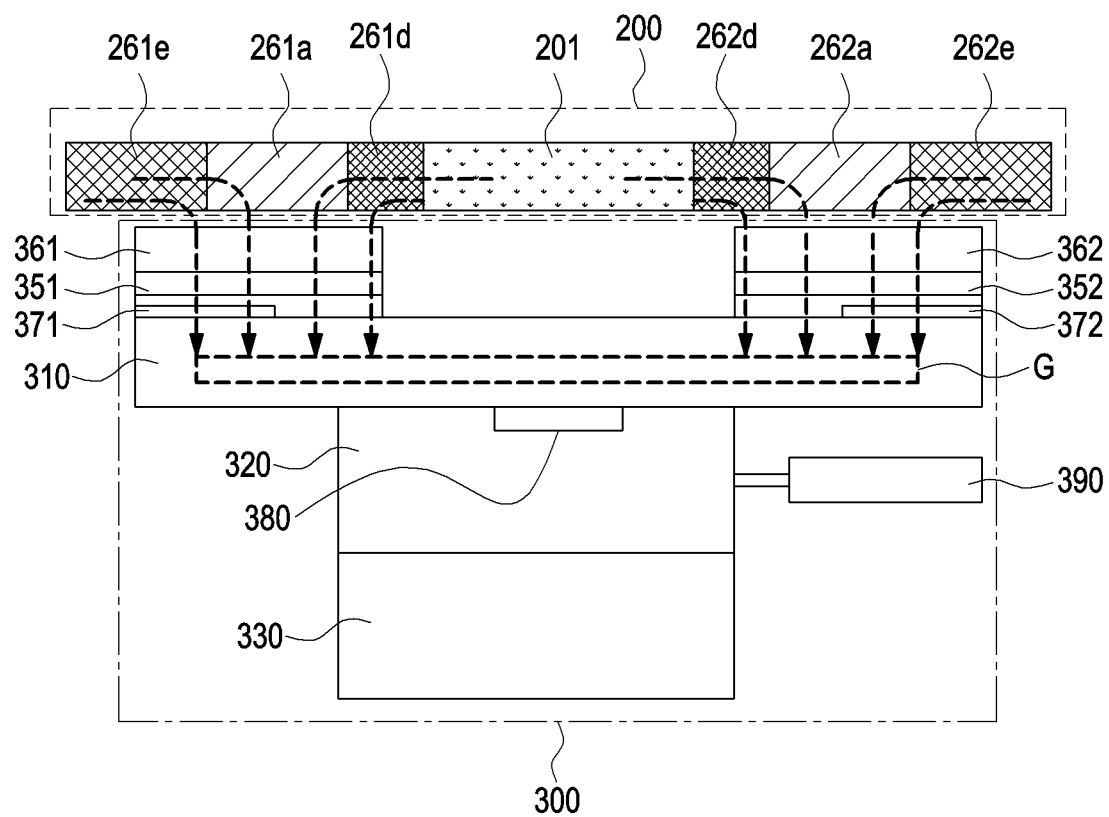
FIG. 10 is a view illustrating a case for preventing static electricity and a method for preventing static electricity using the same according to another embodiment of the disclosure.

Referring to FIG. 9, the static electricity generated in the display member 201 or the first hinge shaft 261a and the second hinge shaft 262a of the wearable electronic device 200 may be transferred to the contact member 360. According to an embodiment, the static electricity generated in the display member 201 of the wearable electronic device may be transferred to the contact member 360 through the first hinge plates 261b and 262b as illustrated in FIG. 9 or, as illustrated in FIG. 10, may be transferred to the contact member 360 without passing through the first hinge plates 261b and 262b. Further, the static electricity generated in the first circuit board (e.g., the first circuit board 241a of FIG. 2) or the second circuit board (e.g., the second circuit board 241b of FIG. 2) of the wearable electronic device may be transferred to the contact member 360 through the second plates 261c and 262c. When static electricity is transferred to the contact member 360, the first electric shock reducing element 370 may operate to electrically connect the second case circuit board 350 and the conductive supporting member 310. If the second case circuit board 350 and the conductive supporting member 310 are conducted by the first electric shock reducing element 370, static electricity may move to the conductive supporting member 310. Through this operation, the static electricity generated in the wearable electronic device may be discharged to the conductive supporting member 310. For example, the conductive supporting member 310 may include a ground area G for discharging static electricity.

According to an embodiment, at least two static electricity discharge paths may be formed in the case 300. For example, a first discharge path using the first electric shock reducing element 370 shown in FIGS. 9 and 10 may be formed, and a second discharge path using the second electric shock reducing element 380 may be formed. The case 300 may include a first case circuit board 320, a battery 330, and an external connector 390 (e.g., a USB connector). These components are described below in connection with the second discharge path shown in FIG. 11. FIG. 10 is a view illustrating a case 300 for preventing static electricity and a method for preventing static electricity using the same according to another embodiment of the disclosure.

FIG. 10 may be a schematic view conceptually illustrating a state in which the first hinge shaft 261a and the second hinge shaft 262a, and the first ground portion 261d and 262d and the second ground portion 261e and 262e of the wearable electronic device 200 contact the contact members 360 disposed on two opposite ends of the conductive supporting member 310 of the case.

While the above-described embodiment of FIG. 9 corresponds to the wearable electronic device 200 according to the embodiment of FIG. 5, the embodiment of FIG. 10 may correspond to the wearable electronic device 200 according to the embodiment of FIG. 6. Those described in connection with the embodiment of FIG. 9 are not repeatedly described below.

In the wearable electronic device 200, only the hinge shaft (e.g., the first hinge shaft 261a and the second hinge shaft 262a) may be connected with the contact member 360, but additionally or alternatively, the ground portions 261d, 262d, 261e, and 262e may be connected to the contact member 360 as shown in FIG. 10. For example, the first ground portions 261d and 262d extending from the lens frame 202 with respect to the hinge shaft 261a may be connected to the contact member 360, or additionally or alternatively, the second ground portions 261e and 262e extending from the wearing members 203a and 203b may be connected to the contact member 360.

Similar to FIG. 9, in the embodiment of FIG. 10, the case 300 may include at least one first electric shock reducing element 370 for preventing static electricity. The at least one first electric shock reducing element 370 may be disposed in a position adjacent to the contact member 360 while being mounted on the second case circuit board 350. According to an embodiment, in the embodiment of FIG. 10, the first electric shock reducing element 370 may be formed to cover a wide area on the second case circuit board 350. For example, when the wearing member (e.g., the first wearing member 203a) is folded about the frame (e.g., the lens frame 202) using the hinge structure (e.g., the first hinge structure 261), when the ground portions 261d, 262d, 261e, and 262e as shown in FIG. 10 are included, various or wider paths through which static electricity is transferred to the contact member 360 may be formed. This can be understood by comparing FIG. 10 with FIG. 9. Accordingly, the first electric shock reducing element 370 in FIG. 10, unlike in the embodiment of FIG. 9, may be formed to cover a wider area on the second case circuit board 350.

Referring to FIG. 10, the static electricity generated in the first ground portions 261d and 262d or the first hinge shaft 261a and the second hinge shaft 262a of the wearable electronic device 200 may be transferred to the contact member 360. Further, the static electricity generated in the second ground portions 261e and 262e of the wearable electronic device 200 may also be transferred to the contact member 360. When static electricity is transferred to the contact member 360, the first electric shock reducing element 370 may operate to electrically connect the second case circuit board 350 and the conductive supporting member 310. If the second case circuit board 350 and the conductive supporting member 310 are conducted by the first electric shock reducing element 370, static electricity may move to the conductive supporting member 310. Through this operation, the static electricity generated in the wearable electronic device may be discharged to the conductive supporting member 310.

Figure 11:
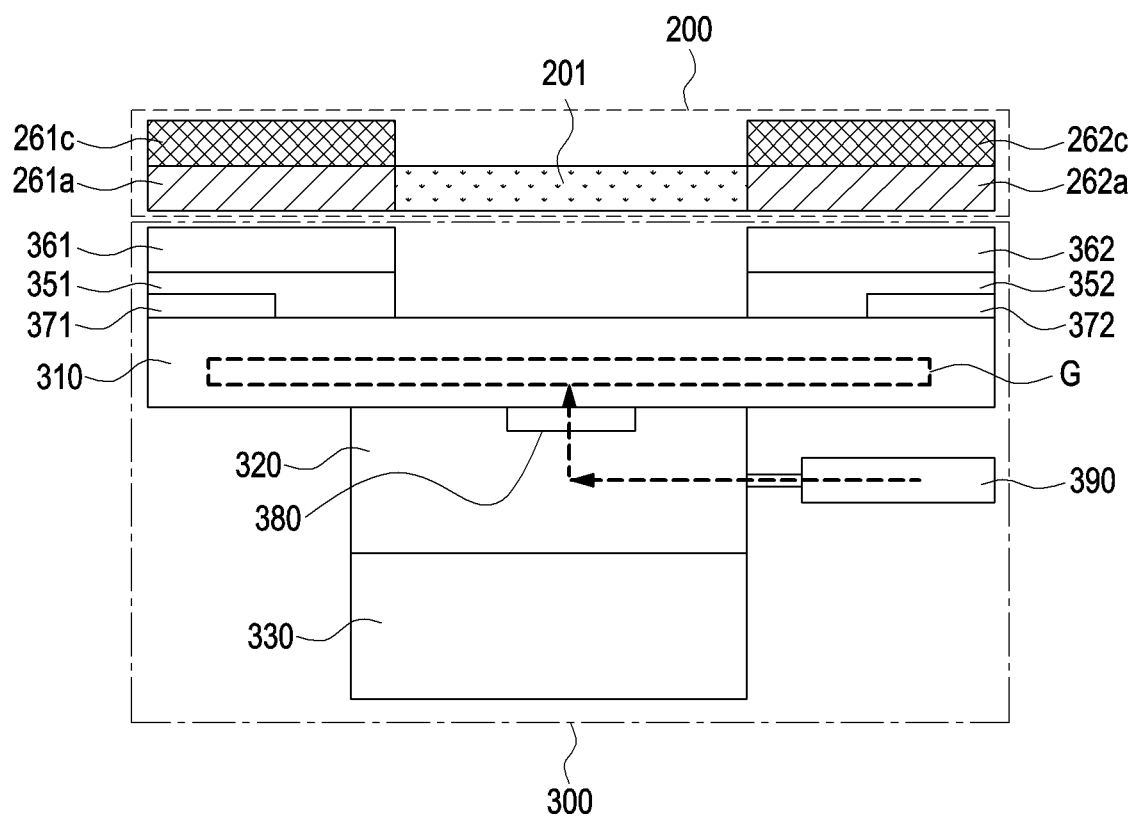
FIG. 11 is a view illustrating a case for preventing static electricity and a method for preventing static electricity using the same according to another embodiment of the disclosure.

FIG. 11 is a view illustrating a case 300 for preventing static electricity and a method for preventing static electricity using the same according to another embodiment of the disclosure.

FIG. 11 may be a schematic view conceptually illustrating a movement path of the static electricity generated when an external connector 390 (e.g., a USB connector) is mounted on the case 300. The embodiment of FIG. 11 may be described based on the embodiment of FIG. 9. Those described in connection with the embodiment of FIGS. 9 and 10 are not repeatedly described below.

According to various embodiments, static electricity may be generated not only when the wearable electronic device 200 is received in the case 300 but also when an external electronic device, e.g., the external connector 390 (e.g., a USB connector) is connected to the case 300. According to various embodiments, a need may exist for a structure to prevent introduction into the case 300 of not only the static electricity generated when the wearable electronic device 200 is received in the case 300 but also the static electricity generated when an external electronic device (e.g. a charger) is connected to the case 300. The static electricity generated when an external electronic device is connected to the case 300 may damage the components of the case 300 and the wearable electronic device 200.

According to an embodiment of the disclosure, the case 300 may include at least one second electric shock reducing element 380 for preventing static electricity from an external electronic device. The at least one second electric shock reducing element 380 may be, e.g., a varistor whose resistance changes according to voltages.

Referring to FIG. 11, the second electric shock reducing element 380 may be disposed between the first case circuit board 320 and the conductive supporting member 310. In this case, the second electric shock reducing element 380 may be formed to provide a discharge path of static electricity on the first case circuit board 320. The static electricity transferred from the external connector 390 may be discharged to the conductive supporting member 310 through the first case circuit board 320 and the electric shock reducing element. According to various embodiments, in a state in which static electricity is not generated, the second electric shock reducing element 380 electrically separates the first case circuit board 320 and the conductive supporting member 310 and, when static electricity is generated, the second electric shock reducing element 380 may electrically conduct the first case circuit board 320 and the conductive supporting member 310. According to an embodiment, the second electric shock reducing element 380 may be configured to electrically separate the first case circuit board 320 and the conductive supporting member 310 when a voltage of less than a designated magnitude is generated in the at least one connector (e.g. the external connector 390) and to electrically connect the first case circuit board 320 and the conductive supporting member 310 when a voltage of more than the designated magnitude is generated. As such, the case 300 may also discharge the static electricity generated outside the case 300. According to the above-described embodiments, it is possible to discharge static electricity that may be generated in the wearable electronic device by providing the electronic device case 300 including the first electric shock reducing element 370 and the second electric shock reducing element 380. Accordingly, it is possible to prevent damage to the wearable electronic device 200 and the electronic device case 300 for storing the wearable electronic device 200 due to static electricity.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment of the disclosure, there may be provided an electronic device case (e.g., the electronic device case 300 of FIG. 4) for storing a wearable electronic device comprising a case housing (e.g., the case housing 301 of FIG. 4) forming a space for receiving the wearable electronic device, a conductive supporting member (e.g., the conductive supporting member 310 of FIG. 7) disposed in the case housing, and a contact member (e.g., the contact member 360 of FIG. 9) disposed in the space for receiving the wearable electronic device and exposed to an exterior when the case housing is opened, electrically connected with the conductive supporting member, and configured to at least partially contact a conductive portion (e.g., at least one of the first hinge shaft 261a, the first hinge plate 261b, and the second hinge plate 261c of FIG. 5 or at least one of the first hinge shaft 261a, the first ground portion 261d, and the second ground portion 261e of FIG. 6) of the wearable electronic device.

According to various embodiments, the conductive supporting member may include a bracket disposed in the case housing.

According to various embodiments, the electronic device case may further comprise a first case circuit board (e.g., the first case circuit board 320 of FIG. 7) disposed in a position adjacent to the conductive supporting member and having a plurality of electronic components mounted thereon.

According to various embodiments, the conductive supporting member may include a plate (e.g., the plate 311a of FIG. 7) and two arms (e.g., the two arms 311b and 311c of FIG. 7) each extending from an end of the plate.

According to various embodiments, the electronic device case may further comprise two second case circuit boards (e.g., the second case circuit board 350 of FIG. 8) disposed adjacent to the two arms of the conductive supporting member.

According to various embodiments, the electronic device case may further comprise a first electric shock reducing element (e.g., the first electric shock reducing element 370 of FIG. 8) mounted on the second case circuit board, configured to electrically separate the second case circuit board and the conductive supporting member when a voltage of less than a designated magnitude is generated, and electrically connect the second case circuit board and the conductive supporting member when a voltage of the designated magnitude or more is generated.

According to various embodiments, the first electric shock reducing element may include at least one varistor.

According to various embodiments, the electronic device case may further comprise at least one connector disposed on a side of the case housing to transmit/receive power or data.

According to various embodiments, the electronic device case may further comprise a second electric shock reducing element (e.g., the second electric shock reducing element 380 of FIG. 9) configured to electrically separate the first case circuit board and the conductive supporting member when a voltage of less than a designated magnitude is generated in the at least one connector and electrically connect the first case circuit board and the conductive supporting member when a voltage of the designated magnitude or more is generated in the at least one connector.

According to various embodiments, the wearable electronic device may be VR glasses or AR glasses.

According to various embodiments, the case housing may include a seating portion (e.g., the seating portion 302 of FIG. 4) for receiving the wearable electronic device and a mounting portion for mounting at least a portion of the wearable electronic device.

According to various embodiments, the mounting portion may include a nose pad mounting portion (e.g., the nose pad mounting portion 302' of FIG. 4) and at least two hinge mounting portions (e.g., the hinge mounting portions 303a and 303b of FIG. 4). The contact member may be formed on one surface of the at least two hinge mounting portions.

According to various embodiments, the conductive portion of the wearable electronic device may be a metallic portion exposed to an outside when the wearable electronic device is folded.

According to various embodiments, the contact member may include an electrically conductive material.

According to various embodiments, the contact member may include a gasket, a polyurethane foam, or a C-clip.

According to various embodiments, the contact member may include a magnetic material.

According to various embodiments of the disclosure, there may be provided an electronic device case (e.g., the electronic device case 300 of FIG. 4) for storing a wearable electronic device (e.g., the wearable electronic device 200 of FIG. 2) comprising a case housing (e.g., the case housing 301 of FIG. 4), a bracket (e.g., the conductive supporting member 310 of FIG. 7) disposed in the case housing, a first case circuit board (e.g., the first case circuit board 320 of FIG. 7) disposed in a position adjacent to the bracket, inside the case housing, a contact member (e.g., the contact member 360 of FIG. 8) disposed to be exposed to an exterior when the case housing is opened and configured to at least partially contact a conductive portion of the wearable electronic device, a second case circuit board (e.g., the second case circuit board 350 of FIG. 8) disposed between the contact member and the bracket, at least one connector disposed on a side of the case housing to transmit/receive power or data, a first electric shock reducing element (e.g., the first electric shock reducing element 370 of FIG. 7) disposed on the second case circuit board, and configured to connect the contact member and the bracket when static electricity is generated in the wearable electronic device, and a second electric shock reducing element (e.g., the second electric shock reducing element 380 of FIG. 9) disposed on the first case circuit board, and configured to connect the at least one connector and the bracket when static electricity is generated in the at least one connector.

According to various embodiments, the first electric shock reducing element may be configured to electrically separate the second case circuit board and the bracket when a voltage of less than a designated magnitude is generated and electrically connect the second case circuit board and the bracket when a voltage of the designated magnitude or more is generated.

According to various embodiments, the second electric shock reducing element may be configured to electrically separate the first case circuit board and the bracket when a voltage of less than a designated magnitude is generated and electrically connect the first case circuit board and the bracket when a voltage of the designated magnitude or more is generated.

According to various embodiments, the wearable electronic device may be VR glasses or AR glasses.

According to various embodiments, the case housing may include a seating portion for receiving the wearable electronic device and a mounting portion for mounting at least a portion of the wearable electronic device. The mounting portion may include a nose pad mounting portion and two hinge mounting portions. The contact member may be formed on one surface of the two hinge mounting portions.

It is apparent to one of ordinary skill in the art that the electronic device case according to various embodiments of the present invention as described above are not limited to the above-described embodiments and those shown in the drawings, and various changes, modifications, or alterations may be made thereto without departing from the scope of the present invention.

What is claimed is:

1. An electronic device case for storing a wearable electronic device, comprising:
   a case housing forming a space for receiving the wearable electronic device;
   a conductive supporting member disposed in the case housing; and
   a contact member disposed in the space for receiving the wearable electronic device and exposed to an exterior when the case housing is opened, electrically connected with the conductive supporting member, and configured to at least partially contact a conductive portion of the wearable electronic device.

2. The electronic device case of claim 1, wherein the conductive supporting member includes a bracket disposed in the case housing.

3. The electronic device case of claim 1, further comprising a first case circuit board disposed in a position adjacent to the conductive supporting member and having a plurality of electronic components mounted thereon.

4. The electronic device case of claim 1, wherein the conductive supporting member includes a plate and two arms each extending from an end of the plate.

5. The electronic device case of claim 4, further comprising two second case circuit boards disposed adjacent to the two arms of the conductive supporting member.

6. The electronic device case of claim 5, further comprising a first electric shock reducing element mounted on one of the two second case circuit boards, configured to electrically separate the one of the two second case circuit boards and the conductive supporting member when a voltage of less than a designated magnitude is generated, and electrically connect the one of the two second case circuit boards and the conductive supporting member when a voltage of the designated magnitude or more is generated.

7. The electronic device case of claim 6, wherein the first electric shock reducing element includes at least one varistor.

8. The electronic device case of claim 3, further comprising at least one connector disposed on a side of the case housing configured to transmit/receive power or data.

9. The electronic device case of claim 8, further comprising a second electric shock reducing element configured to electrically separate the first case circuit board and the conductive supporting member when a voltage of less than a designated magnitude is generated in the at least one connector and electrically connect the first case circuit board and the conductive supporting member when a voltage of the designated magnitude or more is generated in the at least one connector.

10. The electronic device case of claim 1, wherein the wearable electronic device is VR glasses or AR glasses.

11. The electronic device case of claim 1, wherein the case housing includes,
a seating portion configured to receive the wearable electronic device; and
a mounting portion configured to mount at least a portion of the wearable electronic device.

12. The electronic device case of claim 11, wherein the mounting portion includes a nose pad mounting portion and at least two hinge mounting portions, and
wherein the contact member is formed on one surface of the at least two hinge mounting portions.

13. The electronic device case of claim 1, wherein the conductive portion of the wearable electronic device is a metallic portion exposed to an exterior when the wearable electronic device is folded, and
wherein the contact member includes an electrically conductive material.

14. The electronic device case of claim 1, wherein the contact member includes a gasket, a polyurethane foam, or a C-clip.

15. The electronic device case of claim 1, wherein the contact member includes a magnetic material.

16. An electronic device case for storing a wearable electronic device, comprising,
a case housing;
a bracket disposed in the case housing;
a first case circuit board disposed in a position adjacent to the bracket, inside the case housing;
a contact member disposed to be exposed to an exterior when the case housing is opened and configured to at least partially contact a conductive portion of the wearable electronic device;
a second case circuit board disposed between the contact member and the bracket;
at least one connector disposed on a side of the case housing configured to transmit/receive power or data;
a first electric shock reducing element disposed on the second case circuit board, and configured to connect the contact member and the bracket when static electricity is generated in the wearable electronic device; and
a second electric shock reducing element disposed on the first case circuit board, and configured to connect the at least one connector and the bracket when static electricity is generated in the at least one connector.

17. The electronic device case of claim 16, wherein the first electric shock reducing element is configured to electrically separate the second case circuit board and the bracket when a voltage of less than a designated magnitude is generated and electrically connect the second case circuit board and the bracket when a voltage of the designated magnitude or more is generated.

18. The electronic device case of claim 16, wherein the second electric shock reducing element is configured to electrically separate the first case circuit board and the bracket when a voltage of less than a designated magnitude is generated and electrically connect the first case circuit board and the bracket when a voltage of the designated magnitude or more is generated.

19. The electronic device case of claim 16, wherein the wearable electronic device is VR glasses or AR glasses.

20. The electronic device case of claim 16, wherein the case housing includes:
a seating portion configured to receive the wearable electronic device; and
a mounting portion configured to mount at least a portion of the wearable electronic device,
wherein the mounting portion includes a nose pad mounting portion and two hinge mounting portions, and
wherein the contact member is formed on one surface of the two hinge mounting portions.

* * * * *